United States Patent
Bommu et al.

[11] Patent Number: 5,987,636
[45] Date of Patent: Nov. 16, 1999

[54] STATIC TEST SEQUENCE COMPACTION USING TWO-PHASE RESTORATION AND SEGMENT MANIPULATION

[75] Inventors: Surendra K. Bommu, Plansboro; Srimat T. Chakradhar, Old Bridge; Kiran B. Doreswamy, Plainsboro, all of N.J.

[73] Assignee: NEC USA, Inc., Princeton, N.J.

[21] Appl. No.: 09/135,561

[22] Filed: Aug. 18, 1998

Related U.S. Application Data

[60] Provisional application No. 60/086,759, May 27, 1998.
[51] Int. Cl.$^6$ .................................................. G01R 31/28
[52] U.S. Cl. .......................... 714/738; 714/720; 714/728
[58] Field of Search ..................................... 714/738, 741, 714/742, 724, 739, 728, 720; 324/73.1

[56] References Cited

U.S. PATENT DOCUMENTS 5,444,717  8/1995  Rotker et al. .......................... 371/27.1

OTHER PUBLICATIONS

Higami et al, "Static Test Compaction for IDDQ testing of Sequential Circuits", pp. 9–13, IEEE, Mar. 1998.

Guo et al, "on speeding–up Vector Restoration Based Static Compaction of Test Sequences for Sequential Circuits", pp. 467–471, IEEE, Sep. 1998.

Pomeranz et al, "Static Compaction for Two–Pattern Test Sets", The Fourth Asian Test Symposium, IEEE 1995, pp. 222–228.

Srimat T. Chakradhar and Michael S. Hsiao, "Partitioning and Reordering Techniques for Static Test Sequence Compaction of Sequential Circuits" Technical Report 1997, 97–C074–4–5506–5. Computers & Communications Research Lab, NEC USA Inc.

Surendra K. Bommu et al., "Static Test Sequence Compaction Based on Segment Reordering and Accelerated Vector Restoration," Technical Report 1998, 98–C014–4–5099–1. Computers and Communications Research Lab, NEC USA Inc.

Irith Pomeranz and Sudhakar M. Reedy, "Vector Restoration Based Static Compaction of Test Sequences for Synchronous Sequential Circuits" Proceedings Int. Conf. on Computer Design pp. 360–365, 1997. University of Iowa, Aug. 1997.

Timothy J. Lambert and Kewal K. Saluja, "Methods for Dynamic Test Vector Compaction in Sequential Test Generation," in Proc. Int. Conf. on VLSI Design, pp. 166–169, Jan. 1996.

Irith Pomeranz and Sudhakar M. Reedy, "Dynamic Test Compaction for Syncronous Sequential Circuits using Static Compaction Techniques," in Proc. Fault–Tolerant Computing Symp., pp. 53–61, Jun. 1996.

Srimat T. Chakradhar and Anand Raghunathan, "Bottleneck Removal Algorithm for Dynamic Compaction in Sequential Circuits," IEEE Trans. on Computer–Aided Design, (Accepted for publication) 1997.

Michael S. Hsiao et al., "Sequential Circuit Test Generation Using Dynamic State Traversal," Proc. European Design and Test Conf., pp. 22–28, Feb. 1997.

Elizabeth M. Rudnick and Janak H. Patal, "Simulation–Based Techniques for Dynamic Test Sequence Compaction," Proc. Intl. Conf. Computer–Aided Design, pp. 67–73, Nov. 1996.

Primary Examiner—Hoa T. Nguyen
Attorney, Agent, or Firm—Sughrue, Mion, Zinn, Macpeak & Seas, PLLC

[57] ABSTRACT

A technique for static compaction of test sequences is described. The method for static compaction according to the present invention includes two key features: (1) two-phase vector restoration, and (2) identification, pruning, and re-ordering of segments. Segments partition the compaction problem into sub-problems. Segments are identified, dynamically pruned and re-ordered to achieve further compaction and speed up.

9 Claims, 7 Drawing Sheets

ALGORITHM SECO [$F, V, D$]
  $F$ : INITIAL FAULT LIST
  $V$ : ORIGINAL VECTOR SET
  $D$ : DETECTION TIMES OF FAULTS IN $F$
{
1. ParSeg = CompactSet = Nil;
2. $Target$ = CHOOSE_NEXT_TARGET [$F_u, D$];
3. while($Target$ exists){
4.     $2\phi$[$Target, ParSeg, D$];
5.     if (NEW_SEGMENT ($ParSeg, F_u, D$)){
6.         SEGMENT_PRUNE [$ParSeg$];
7.         SEGMENT_MERGE [$F_u, ParSeg, CompactSet$];
8.         $ParSeg$ = Nil;
    }
9.     $Target$ = CHOOSE_NEXT_TARGET[$F_u, D$];
}
10. return (CompactSet);
}

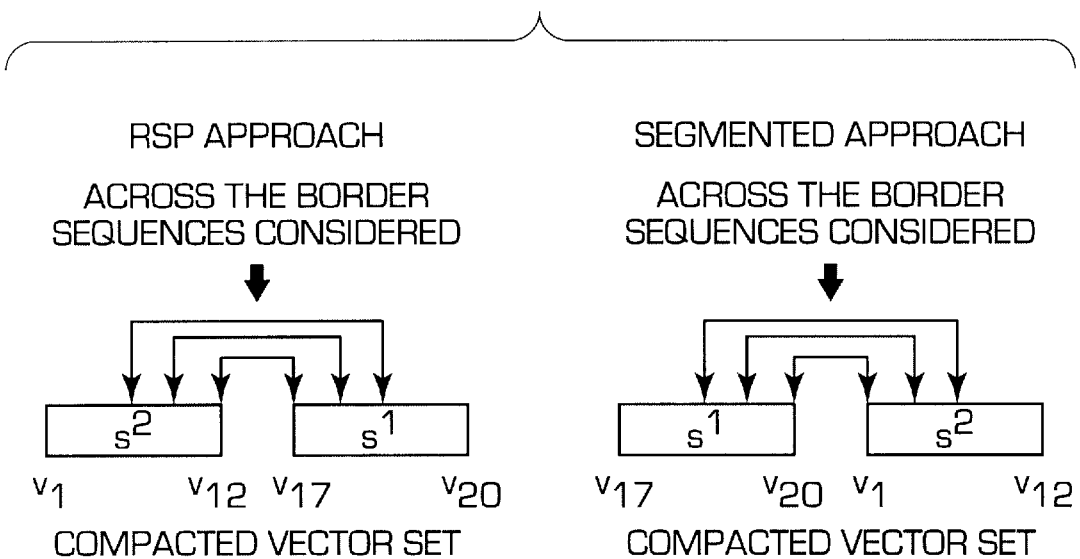

ALGORITHM SEGMENT PRUNE [$Seg$, $F_{Seg}$]
  $Seg$ : SEGMENT OF VECTORS $v_i, ..., v_k$
  $F_{Seg}$ : SET OF FAULTS DETECTED BY SEGMENT ASSUMING
       UNKNOWN INITIAL STATE
{
1. $j = 1$
2. do{
3.     $Seq = v_{i+j}, ..., v_k$
4.     STORED_FAULT_SIM($F_{Seg}$, Seq);
5.     $j$++;
6. }while (All faults $F_{Seg}$ are detected)
7. $Seg = v_{i+j-1}, ..., v_k$
8. return [$Seg$];
}

TABLE 1: COMPACTION RESULTS FOR ISCAS CIRCUITS USING HITEC TEST SETS

| CKT | ORIGINAL VEC | INITIAL SIM. TIMES (s) | IMPROVED RSP | | | SEC WITH 2-φ* | | |
|---|---|---|---|---|---|---|---|---|
| | | | VEC | %R | TIME (s) | VEC | %R | TIME (s) |
| s298 | 322 | 0.3 | 216 | 32 | 7.1 | 216 | 32 | 0.8 |
| s344 | 127 | 0.2 | 50 | 60 | 0.5 | 61 | 51 | 0.3 |
| s382 | 2074 | 4.6 | 877 | 57 | 47.9 | 878 | 57 | 6.0 |
| s444 | 2240 | 5.5 | 820 | 63 | 83.8 | 1005 | 55 | 7.5 |
| s526 | 2258 | 6.8 | 1526 | 32 | 296.8 | 1526 | 32 | 12.0 |
| s641 | 209 | 0.4 | 123 | 41 | 2.8 | 125 | 40 | 0.8 |
| s713 | 173 | 0.4 | 114 | 34 | 3.4 | 106 | 38 | 0.8 |
| s820 | 1115 | 2.1 | 788 | 29 | 148.5 | 790 | 29 | 5.9 |
| s832 | 1137 | 2.2 | 778 | 31 | 146.9 | 779 | 31 | 6.5 |
| s1196 | 435 | 1.1 | 284 | 35 | 29.8 | 281 | 35 | 2.2 |
| s1238 | 475 | 1.3 | 296 | 38 | 31.4 | 303 | 36 | 2.7 |
| s1423 | 150 | 2.2 | 134 | 10 | 12.5 | 134 | 10 | 4.2 |
| s1488 | 1170 | 4.4 | 827 | 29 | 331.2 | 828 | 29 | 10.0 |
| s1494 | 1245 | 4.7 | 852 | 31 | 355.6 | 855 | 31 | 11.0 |
| s5378 | 912 | 22.1 | 647 | 29 | 538.1 | 653 | 28 | 39.0 |
| s35932 | 496 | 198.0 | 207 | 58 | 2188.8 | 202 | 59 | 487.0 |

VEC: TEST SET LENGTH
TIME: EXECUTION TIME
%R: PERCENT REDUCTION FROM ORIGINAL TEST SET SIZE

FIG. 7

TABLE 2 : COMPACTION RESULTS FOR PRODUCTION CIRCUITS

| CKT | GATES | FFs | ORIGINAL VEC | INITIAL SIM. TIMES (s) | IMPROVED RSP | | | SECO | | | |
|---|---|---|---|---|---|---|---|---|---|---|---|
| | | | | | VEC | %R | TIME (s) | VEC | %R | TIME (s) 2-φ | 2-φ* |
| p7A | 7784 | 137 | 1702 | 98 | 995 | 41 | 4501 | 989 | 41 | 199 | 185 |
| p7B | 6687 | 130 | 2267 | 95 | 1700 | 25 | 10199 | 1650 | 27 | 188 | 179 |
| p12 | 8489 | 408 | 3510 | 347 | NA | NA | NA | 2505 | 33 | 635 | 589 |
| p20 | 12145 | 487 | 2318 | 301 | NA | NA | NA | 1894 | 18 | 1962 | 877 |
| p30 | 24824 | 995 | 1836 | 186 | NA | NA | NA | 1141 | 37 | 1152 | 974 |
| p29 | 62617 | 935 | 9366 | 2097 | NA | NA | NA | 7201 | 23 | 13997 | 12380 |
| p306 | 223962 | 5005 | 3499 | 3520 | NA | NA | NA | 3399 | 2 | 69829 | 31968 |

GATES : NUMBER OF GATES
FFs : NUMBER OF FLIP-FLOPS
VEC : TEST SET LENGTH
%R : PERCENT REDUCTION FROM ORIGINAL TEST SET SIZE

FIG. 8

TABLE 3 : COMPACTION RESULTS OF SECO WITH SEGMENT PRUNING

| CKT | ORIGINAL VEC | SECO WITH PRUNING | | |
|---|---|---|---|---|
| | | VEC | %R | TIME (s) |
| s298 | 322 | 212 | 34 | 0.9 |
| s344 | 127 | 47 | 62 | 0.3 |
| s382 | 2074 | 870 | 58 | 6.2 |
| s444 | 2240 | 813 | 63 | 7.7 |
| s526 | 2258 | 821 | 63 | 9.9 |
| s641 | 209 | 110 | 47 | 0.9 |
| s713 | 173 | 98 | 43 | 3.4 |
| s820 | 1115 | 675 | 39 | 7.0 |
| s832 | 1137 | 648 | 43 | 7.7 |
| s1196 | 435 | 254 | 41 | 2.5 |
| s1238 | 475 | 270 | 43 | 2.8 |
| s1423 | 150 | 125 | 16 | 12.0 |
| s1488 | 1170 | 790 | 32 | 14.0 |
| s1494 | 1245 | 758 | 39 | 13.0 |
| s5378 | 912 | 556 | 39 | 50.0 |
| s35932 | 496 | 124 | 74 | 497.0 |
| p7A | 1702 | 969 | 43 | 190.0 |
| p20 | 2318 | 1851 | 20 | 1006.0 |
| p29 | 9366 | 7018 | 25 | 13510.0 |
| p30 | 1836 | 1152 | 37 | 991.0 |
| p12 | 3510 | 2310 | 34 | 620.0 |

TIME : EXECUTION TIME IN SECONDS
VEC : TEST SET LENGTH
%R : PERCENT REDUCTION FROM ORIGINAL TEST SET SIZE

ND USING TWO-PHASE RESTORATION AND
SEGMENT MANIPULATION

I. DESCRIPTION OF THE INVENTION

This application claims priority from co-pending U.S. Provisional patent application Ser. No. 60/086,759 filed on May 27, 1998.

IA. FIELD OF THE INVENTION

This invention relates to a method for static compaction of sequence of test vectors that are used to detect faults in large industrial designs. Specifically, this invention relates to a method for static compaction comprising a restoration phase and a segment manipulation phase. This invention is embodied in a method for static test sequence compaction that is shown to be practical for improving performance and efficiency of fault diagnosis for large designs.

IB. BACKGROUND OF THE INVENTION

IB1. Review of Static Compaction

A vector is a set of inputs to a system. A test set is a set of vectors that identify faults in the system. Target faults are the faults that are identified by a given set. Since cost of testing is directly proportional to the number of test vectors in the test set, short test sequences are desirable. Reduction in test set size can be achieved using static or dynamic test set compaction algorithms.

Dynamic techniques perform compaction concurrently with the test generation process. See I. Pomeranz and S. M. Reddy, "Dynamic Test Compaction for Synchronous Sequential Circuits using Static Compaction Techniques," *Proc. Fault-Tolerant Computing Symp.*, pp. 53–61, June 1996; S. T. Chakradhar and A. Raghunathan, "Bottleneck removal algorithm for dynamic compaction in sequential circuits," *IEEE Trans. on Computer-Aided Design*, (Accepted for publication) 1997; E. M. Rudnick and Janak H. Patel, "Simulation-based techniques for dynamic test sequence compaction," *Proc. Int. Conf. Computer-Aided Design*, pp. 67–73, Nov. 1996; and T. J. Lambert and K. K. Saluja, "Methods for Dynamic Test Vector Compaction in Sequential Test Generation," *Proc. Int. Conf. on VLSI Design*, pp. 166–169, Jan. 1996. Dynamic techniques often require modification of the test generator.

Static compaction techniques, on the other hand, are employed after the test generation process. Hence they are independent of the test generation algorithm and do not require modifications to the test generator. In addition, static compaction techniques can further reduce the size of test sets obtained after dynamic compaction.

Several static compaction approaches for sequential circuits have been proposed in the following references: T. M. Niermann, R. K. Roy, I. H. Patel, and J. A. Abraham, "Test compaction for sequential circuits," *IEEE Trans. Computer-Aided Design*, vol. 11, no. 2, pp. 260–267, Feb. 1992; B. So, "Time-efficient automatic test pattern generation system," Ph.D. Thesis, EE Dept., Univ. of Wisconsin at Madison, 1994; I. Pomeranz and S. M. Reddy, "On static compaction of test sequences for synchronous sequential circuits," *Proc. Design Automation Conf.*, pp. 215–220, June 1996; M. S. Hsiao, E. M. Rudnick, and J. H. Patel, "Fast algorithms for static compaction of sequential circuit test vectors," *Proc. IEEE VLSI Test Symp.*, pp. 188–195, Apr. 1995.

But, some of these approaches cannot reduce test sets produced by random or simulation-based test generators. See T. M. Niermann, R. K. Roy, I. H. Patel, and J. A. Abraham, "Test compaction for sequential circuits," *IEEE Trans. Computer-Aided Design*, vol. 11, no. 2, pp. 260–267, Feb. 1992; B. So, "Time-efficient automatic test pattern generation system," Ph.D. Thesis, EE Dept., Univ. of Wisconsin at Madison, 1994. Static compaction techniques based on vector insertion, omission, and selection have been investigated in I. Pomeranz and S. M. Reddy, "On static compaction of test sequences for synchronous sequential circuits," *Proc. Design Automation Conf.*, pp. 215–220, June 1996.

These techniques require multiple fault simulation passes. If a vector is omitted or swapped, the fault simulator is invoked to make sure that fault coverage is not affected. Though these techniques produce very good compaction, they are too computationally intensive to be practical.

Vector restoration techniques aim at restoring sufficient vectors necessary to detect all faults, starting with harder faults. See R. Guo, I. Pomeranz, and S. M. Reddy, "Procedures for static compaction of test sequences for synchronous sequential circuits based on vector restoration," *Technical Report* 8-3-1997, Electrical and Computer Engineering Department, University of Iowa, 1997. Fast static test set compaction based on removing recurring subsequences that start and end on the same states has also been reported recently in M. S. Hsiao, E. M. Rudnick, and J. H. Patel, "Fast algorithms for static compaction of sequential circuit test vectors," *Proc. IEEE VLSI Test Symp.*, pp. 188–195, Apr. 1995. However, these test sets are not as compact as those achieved by algorithms that use multiple fault simulation passes.

Recently, compaction based on vector reordering has also been proposed. See S. T. Chakradhar and M. S. Hsiao, "Partitioning and Reordering Techniques for Static Test Sequence Compaction of Sequential Circuits," *Technical Report* 1997, Computers & Communications Research Lab, NEC USA Inc.

Among the known static compaction methods, compaction techniques based on vector restoration have yielded the largest compaction. See I. Pomeranz and S. M. Reddy, "Vector Restoration Based Static Compaction of Test Sequences for Synchronous Sequential Circuits," *Proceedings Int. Conf. on Computer Design*, pp. 360–365, University of Iowa, Aug. 1997; R. Guo, I. Pomeranz, and S. M. Reddy, "Procedures for static compaction of test sequences for synchronous sequential circuits based on vector restoration," *Technical Report* 8-3-1997, Electrical and Computer Engineering Department, University of Iowa, 1997.

IB2. Review of Vector Restoration Based Compaction

The test set V is an ordered sequence of vectors $v_1, \ldots, v_n$. The test set detects faults $f_1, \ldots, f_z$ that form the fault set F. The goal of compaction algorithms is to reduce the test set without compromising on the detectability of all faults in F. If a fault is detected at vector $v_i$ of the test set, then the detection time D(f) of the fault is i. This information can be easily obtained by a pre-processing phase that involves fault simulation (with fault dropping) of test set T.

For example, the test set in FIG. 1 has 20 vectors $v_1, \ldots, v_{20}$. This test set detects five faults $f_1, \ldots, f_5$. Fault $f_5$ is detected at vector $v_{20}$. Therefore, $D(f_5)=20$. Detection times for other faults are as shown in the figure.

Static compaction methods based on vector restoration is based on the following framework. Given a test set, fault set, and detection time for every fault, static compaction methods produce a shorter test set that detects at least as many faults as the original test set. A set of faults is chosen initially as the target faults. These faults can have the same or different detection times. If the latest detection time of any fault in the target list is t, then the restoration process finds a subsequence $v_i, \ldots, v_t$ ($1 \leq i \leq t$) (1) detects all faults in the target fault list, and (2) if the subsequence is pre-pended to the restored subsequence for earlier target faults, then all earlier target faults are also detected. The next set of target faults is chosen from the faults that remain undetected by the restored vector set. This process is continued until there are no more target faults.

The techniques that rely on fault simulation to satisfy step 2 described above, are computationally intensive and impractical on large industrial designs. Among the known vector based compaction methods, the restoration omitting synchronizing prefix (RSP) is the only method which does not involve simulation to satisfy step 2. See I. Pomeranz, and S. M. Reddy, "Vector Restoration Based Static Compaction of Test Sequences for Synchronous Sequential circuits," *Proceedings Int. Conf. on Computer Design*, pp. 360–365, University of Iowa, Aug. 1997.

In the RSP approach, sufficient vectors are restored such that the target fault is detected starting from all unknown initial states. Consequently, independent of further additions to the restored vector sets, faults once chosen for restoration remain detected throughout the remainder of the compaction process.

A linear vector restoration method determines the subsequence by first considering only vector $v_t$. If all target faults are not detected, then the subsequence $v_{t-1}, v_t$ is proposed. If this sequence also does not detect all target faults, then additional vectors $v_{t-2}, \ldots, v_1$ (in that order) are considered until all target faults are detected. More details about the complexity of this technique will be provided below.

Among the known vector restoration based compaction methods, the RSP approach requires fewer CPU seconds. Unfortunately, even the RSP approach is too slow to be practical on large industrial designs (See Table 2 in FIG. 7).

The conventional static compaction techniques including the RSP technique have at least a major problem that limit their practical usage. They require prohibitively large runtimes when used for testing of large industrial designs.

II. SUMMARY OF THE INVENTION

It is therefore an objective of this invention to provide techniques to improve performance and efficiency of static compaction methods as applied to fault detection in large industrial designs.

Specifically it is an object of this invention to provide a method for compacting a sequence of test vectors for testing a system having a set of faults detectable by said sequence of test vectors.

To achieve the objects of this invention there is provided a method for compacting a sequence of test vectors for testing a system, said system having a set of faults detectable by the sequence of test vectors, a subset of said set of faults being chosen as target faults, said method comprising a restoration phase and a segment manipulation phase, wherein said restoration phase identifies segments of said vectors, each of said segments detects one of said target faults, and said segment manipulation phase further comprises re-ordering, pruning and merging said segments.

Further improvements include a method for compacting a sequence of test vectors, wherein said restoration phase comprises a validation subphase and a refinement subphase; said validation subphase identifies a first subsequence of test vectors that detects the target fault and a second subsequence that does not detect the target fault; and said refinement subphase identifies the shortest subsequence in between the first subsequence and the second subsequence that detects the target fault.

Another aspect of this invention is a method for compacting a sequence of test vectors for testing a system, said system having a set of faults detectable by the sequence of test vectors, to form a compact vector set, wherein said compacted vector set is restored by merging of segments of vectors.

Further improvements include a method for compacting a sequence of test vectors wherein said segments are pruned so as to eliminate redundant synchronization sequences.

Yet another aspect of this invention is a method for compacting a sequence of test vectors wherein segments when found are merged into a compact set, said method comprise: identifying test vectors, a fault list comprising faults that can be detected using said test vectors and detection times for said faults; selecting target faults if said target faults exist; performing two-phase vector restoration and augmenting a partial segment set if the restoration process detects target faults selected; pruning the segment obtained if partial segment set is a segment; merging the segment obtained if partial segment set is a segment; repeating the process while target faults exist.

Still further improvements include a method for compacting a sequence of test vectors wherein the merging phase comprises: simulating new segment from known initial state obtained after simulating vectors in the current compacted vector set; adding the new segment to the end of the compacted vector set.

Still further improvements include a method for compacting a sequence of test vectors wherein the two-phase vector restoration comprises: performing overlapped validation such that if two faults have restored sequences that overlap then the two faults are merged as one target fault; and performing overlapped refinement if a segment that detects target faults exists.

Another aspect of the present invention is a method for compacting a sequence of test vectors wherein the pruning phase comprises: assigning j=1; creating a sequence list having a j-th element of the input segment as a first element, and the last element of the input segment as the last element; running simulation to simulate the faults that are detected by the input segment from the known initial state obtained after simulation of the vectors in the compact set; Assigning j=j+1 and repeating until the subset of the input faults is no longer detected; outputting segment starting with j−1 element of the input segment and ending with the last element of the input segment.

Another aspect of the present invention is a method of compaction comprising the use of segments. Improvements include the method further comprising the use of segment pruning and the method further comprising the use of segment re-ordering.

III. BRIEF DESCRIPTION OF THE DRAWINGS

The above objectives and advantages of the present invention will become more apparent by describing in detail preferred embodiments thereof with reference to the attached drawings in which:

FIG. 3 shows a pseudo-code implementation for SECO, an embodiment of a two-phase segment restoration algorithm.

FIG. 4 shows a diagram illustrating the difference between the RSP approach and the approach of the present invention in processing segments, as it relates to the compaction quality.

FIG. 5 shows pseudo-code for segment pruning algorithm.

FIG. 6 depicts Table 1 that shows simulation experiment results.

FIG. 7 depicts Table 2 that shows compaction results for production circuits.

FIG. 8 depicts Table 3 that shows compaction results of SECO with Segment Pruning.

IV. DETAILED DESCRIPTION OF THE INVENTION

The algorithm for static compaction according to the present invention can be used to compact functional or random vector sets, or vector sets obtained from automatic test generation tools. Present invention is partially based on the concept of vector restoration. Some of the main features that distinguish the present invention from the prior art are: (1) a new two-phase vector restoration technique, and (2) a new concept of segments.

Two-phase vector restoration provides significant computational advantage over other vector restoration approaches. The concepts of segments; segment pruning and segment re-ordering of the present invention are also applicable to existing compaction methods to achieve further compaction.

The two-phase vector restoration method is disclosed in detail in U.S. patent application Ser. No. 09/112,945 by Bommu, et al., and is incorporated herein by reference. A detailed description of the segment pruning, segment merging, and segment re-ordering procedures will be provided below.

IVA. New Static Compaction Algorithm

Figure 2:
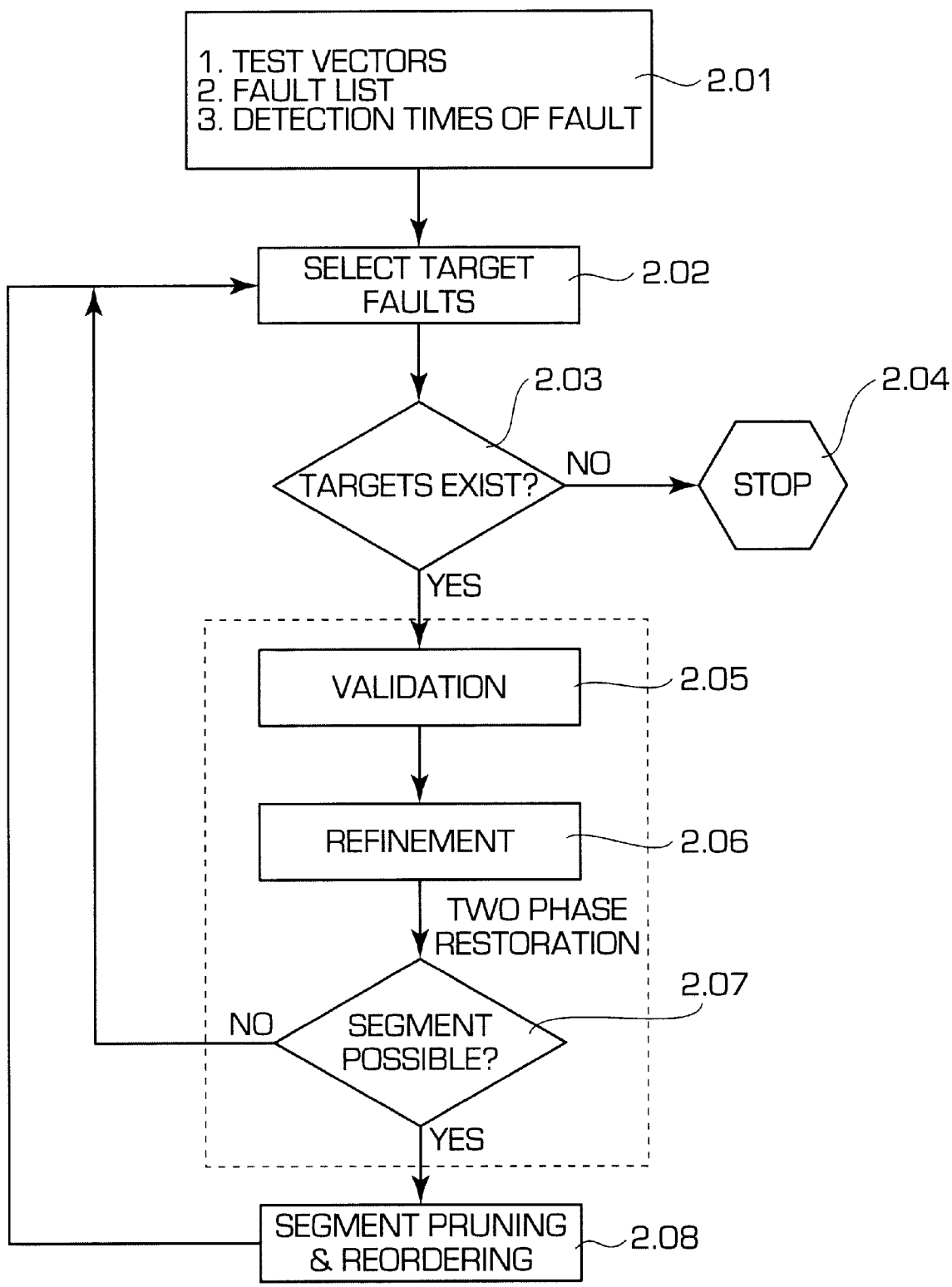
FIG. 2 shows block diagram illustrating compaction using two-phase restoration algorithm.

The flow-chart of an embodiment of the compaction algorithm according to the present invention is shown in FIG. 2. The algorithm inputs a set of test vectors and a list of faults to be detected, together with their detection times, in 2.01. After selection of a set of target faults in 2.02 and checking if such targets exist in 2.03, the two-phase vector restoration procedure comprising validation phase 2.05 and refinement phase 2.06 is executed. Condition 2.07 verifies if the restored vector sequence contains a segment. If it does, the segment manipulation phase 2.08 performs pruning and reordering of the found segment. The execution then continues with selection of a new set of target faults in 2.02, as long as such target faults exist.

Like the RSP, this algorithm is based on vector restoration. However, it differs from the RSP approach in two significant ways:
1. Linear vector restoration process is replaced by a two-phase restoration process that provides significant computational advantage for large circuits.
2. Unlike RSP, two-phase restoration process identifies segments rather than a single monolithic subsequence that detects all faults in the fault set. Segments are subsequences that can be pruned and re-ordered to achieve further compaction.

Some of the main features of the compaction algorithm of the present invention are segment manipulation and two-phase vector restoration. Segment manipulation and two-phase vector restoration techniques are described below.

IVB. Segment Reordering

In the RSP approach described in the background section, compacted vector set restored thus far is considered for fault simulation during the restoration process for all future targets. Experiments have shown that repeated simulation of vector set restored for previous targets, during the restoration of current and future targets, results in a huge increase in run-times for the RSP approach.

Figure 1:
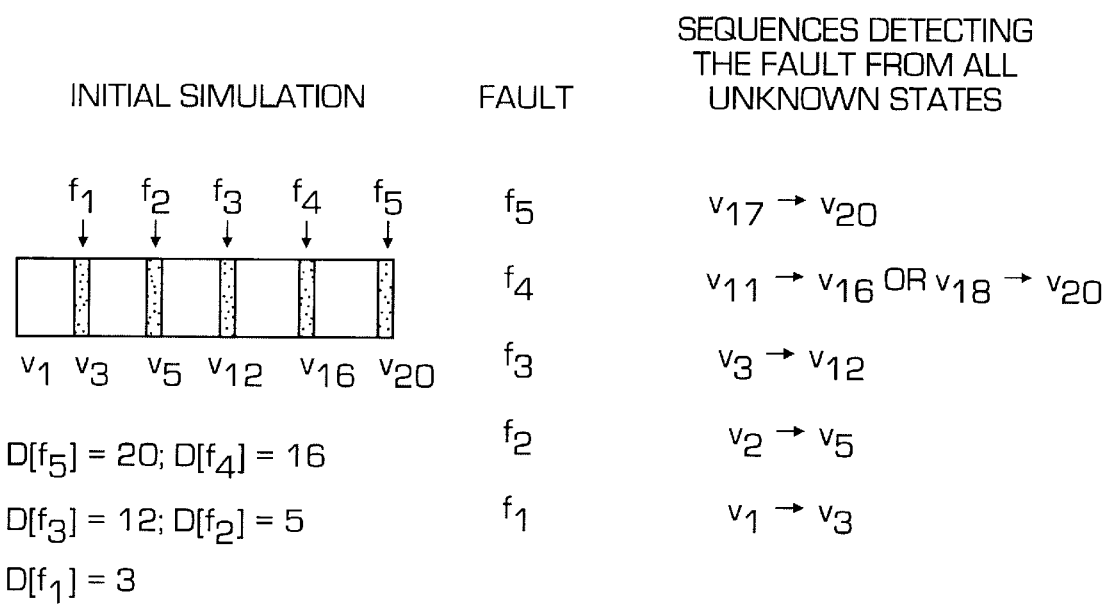
FIG. 1 shows an example of a test vector set and a set of faults with their respective detection times.

According to the present invention, vector sequences are restored in segments. A segment is a subsequence $v_i, \ldots, v_j$ $91 \leq i \leq j \leq n$) such that, for any future target fault f, the detection time $D(f) < i$. In the example of FIG. 1 the restoration process for fault $f_5$ results in the subsequence $v_{17}, \ldots, v_{20}$. At this point, faults $f_1$, $f_2$, and $f_3$ are not detected by the restored sequence. The detection times of all these faults is earlier than 17. Therefore, subsequence $v_{17}, \ldots, v_{20}$ is a segment. Because $f_4$ has a later detection time than $f_3$, and because $f_4$ is detected by the restored sequence, $f_4$ cannot be a future target fault.

A segment results from the restoration process for one or more target faults. Every target fault corresponds to a unique segment. Once a segment is identified, vectors in the segment are not considered during restoration of any future target faults. During the restoration process for target fault f, only vectors that will eventually be in the segment for f are considered for fault simulation.

In the example of FIG. 1 the restored sequence $v_{17}, \ldots, v_{20}$ for target fault $f_5$ is a segment. Future target faults like $f_3$ can only result in one or more new segments. Hence, restoration process for $f_3$ does not consider segment $v_{17}, \ldots, v_{20}$ for fault simulation. If the compaction process is continued, the restored vector sequence for fault $f_3$ is $v_5, \ldots, v_{12}$. This subsequence is not a segment. This is because fault $f_2$ is not detected, and $D(f_2) \leq 5$. Fault $f_2$ is the next target. Restoration process for $f_2$ considers subsequence $v_5, \ldots, v_{12}$ for fault simulation. Vector restoration for $f_2$ results in the sequence $v_2, \ldots, v_{12}$. Again, this sequence is not a segment. This is because fault $f_1$ is not detected, and $D(f_1) \geq 2$. Fault $f_1$ is the next target. Restoration of fault $f_1$ results in the sequence $v_1, \ldots, v_{12}$. Since there are no more undetected faults, this sequence is a segment. In summary, there are two segments: (1) subsequence $v_{17}, \ldots, v_{20}$ that detects faults $f_4$ and $f_5$, and (2) subsequence $v_1, \ldots, v_{12}$, that detects faults $f_1$, $f_2$ and $f_3$.

An embodiment of the compaction algorithm of the present invention is described by the pseudo-code presented in FIG. 3. Lines 6 (segment pruning) and 7 (segment merging) correspond to segment manipulation. Segment pruning and segment merging are discussed in details below.

According to the compaction algorithm, fault simulation is performed for the initial fault list F and original vector set V to determine detection times D for faults in F. During compaction, segments are merged as and when they are found into a set of vectors called CompactSet. Compaction is complete when sequence CompactSet detects all faults in the initial fault list.

CompactSet includes vectors in all segments identified thus far. The set of vectors constituting the current partial segment are stored in ParSeg. Both CompactSet and ParSeg sets are initially empty. Initially, every fault in F is added to the set $F_u$. During compaction, the set $F_u$ includes only faults that are not detected by vectors in CompactSet or ParSeg.

The procedure Choose_Next_Target() selects target faults for the vector restoration phase. According to the present invention, faults for vector restoration are considered in the decreasing order of their detection times. For example, fault $f_5$ in FIG. 1 is detected at $v_{20}$, while fault $F_4$ is detected at $v_{16}$. The subsequence detecting fault $f_4$ cannot also detect $f_5$. This is because $f_5$ has a later detection time. However, subsequence that detects $f_5$ could detect $f_4$ (or any fault with detection time less than that of $f_5$). Therefore, faults with later detection times are considered first as target faults for vector restoration. Because more than one fault can have the same detection time, a set of faults in $F_t$, as opposed to a single fault, can be chosen as targets for a restoration phase.

After a target is chosen, the two-phase restoration procedure described below augments ParSeg to detect the target. The procedure New_Segmento checks if the subsequence ParSeg is a segment (Line 5, algorithm in FIG. 3). If a new segment is found, then the segment is included in CompactSet. ParSeg is then reset because vectors restored for future targets will form a new segment.

The segment merging process consists of several steps. According to the present invention, the fault simulator stores good and faulty circuit states for undetected faults after simulation of vectors in CompactSet. As a first step in the merging process, the new segment is considered for fault simulation. The initial state of the fault simulator is the same as that obtained after simulation of vectors in CompactSet. Therefore, faults being simulated not only see vectors in the new segment but they also see new sequences formed across the boundaries of CompactSet and the new segment (see FIG. 4).

The merging process of the present invention can be illustrated by considering merging of CompactSet=$v_{17}, \ldots, v_{20}$ and ParSeg=$v_1, \ldots, v_{12}$ in the example of FIG. 1. The faulty states of faults $f_1$, $f_2$ and $f_3$ after simulation on CompactSeg are assumed to be known. During fault simulation, faults $f_1$, $f_2$ and $f_3$ are not only seeing subsequences in ParSeg but they are also seeing subsequences across CompactSet and ParSeg.

For example, if the sequence $v_{20}, v_1, v_2$ were to detect $f_3$, then by doing fault simulation from known initial states, fault $f_3$ would be dropped at $v_2$ instead of $v_{12}$. This is the reason why compaction quality of the approach of the present invention does not suffer adversely as in the RSP approach. The segmented approach provides an opportunity for doing better than the RSP approach in terms of compaction quality also. The RSP approach considers subsequences across the boundaries of sequences ParSeg, and CompactSet by doing costly, repetitive simulations. In contrast, the segmented approach considers all subsequences across the boundaries of sequences CompactSet and ParSeg in a single fault simulation. This results in a significant speed up of the overall compaction procedure. FIG. 4 pictorially explains the difference between the RSP and the described approach in processing segments.

After segment fault simulation, the new segment is added to the end of the sequence CompactSet. This completes the merging process. The next target fault is determined and the compaction process continues. Compaction is complete when there are no target faults. The final, compacted vector set is available in CompactSet.

IVC. Two-phase Vector Restoration The two-phase vector restoration algorithm is described in detail in co-pending U.S. patent application Ser. No. 09/112,945.

IVD. Accelerated Two-Phase Vector Restoration

The accelerated two-phase vector restoration algorithm is described in detail in co-pending U.S. patent application Ser. No. 09/112,945.

IVE. Segment Pruning

The techniques of the present invention described above are mainly aimed at speeding up the compaction procedure. Another aspect of the present invention, segment pruning, on the other hand, is aimed at improving compaction quality by avoiding redundant use of synchronizing sequences.

During segment restoration, faults are simulated assuming unknown initial states. Therefore, two segments can have common initialization sequence. Consequently, further compaction is achieved by retaining the synchronizing sequence of the first segment and then pruning synchronizing sequences of all other segments.

An embodiment of the segment pruning algorithm is described by pseudo-code shown in FIG. 5. The procedure begins with segment Seg consisting of vectors $v_i, \ldots, v_k$. The set $F_{seg}$ includes faults whose restoration phases created segment Seg. $F_{seg}$ can also be viewed as the set of faults detected by Seg starting from an unknown initial state. As explained above, CompactSet includes prior segments.

According to the present invention, good and faulty states after fault simulation of CompactSet are being stored. If the sequence $v_{i+1}, \ldots, v_j$ does not detect all faults in $F_{seg}$ (starting from known initial states available after simulation of CompactSet), then no pruning of the segment is possible. Otherwise, the sequence $v_{i+2}, \ldots, v_j$ is considered and fault simulation is performed using that sequence. This process is continued until a sequence $v_k, \ldots, v_j$ ($i \leq k \leq j$) that cannot be pruned further is found.

In the example of FIG. 1 the first segment found is $v_{17}, \ldots, v_{20}$. Since this is the first segment, no pruning is attempted. The next segment found is $v_1, \ldots, v_{12}$. It is assumed that good and faulty states of faults $f_1$, $f_2$ and $f_3$ after simulation of the first segment are available. The pruning of second segment proceeds as follows. First, sequence $v_2, \ldots, v_{12}$, and faults $f_1$, $f_2$, and $f_3$ are considered for fault simulation. Since $f_1$ is not detected, no pruning of segment is possible.

IVF. Experimental Results

The static compaction technique according to the present invention is embodied in a C program called SECO. The embodiment includes all techniques of the present invention described above. To make a fair comparison, an improved version of the RSP approach is also implemented. See I. Pomeranz, and S. M. Reddy, "Vector Restoration Based Static Compaction of Test Sequences for Synchronous Sequential circuits," *Proceedings Int. Conf. on Computer Design*, pp. 360–365, 1997, University of Iowa, Aug. 1997.

The RSP approach, as proposed in the last reference, performs simulation on a single fault during the vector restoration process. The RSP approach is augmented to consider multiple faults during vector restoration. In the present implementation of the RSP algorithm, faults with the same detection time are considered simultaneously for restoration. Thus, the procedure takes advantage of the parallel fault simulator used in the implementation. Present implementation of RSP is referred to as Improved RSP.

Experimental results are reported for ISCAS benchmark circuits and several industrial designs. See F. Brglez, D. Bryan, and K. Kozminski, "Combinational profiles of sequential benchmark circuits," *Int. Symposium on Circuits and Systems*, pp. 1929–1934, May 1989. The SECO is compared with the Improved RSP approach. Table 1 shown in FIG. 6 presents results for ISCAS circuits. Table 2 shown in FIG. 7 presents results for several industrial designs.

All the tables report number of vectors in the original and compact vector set. Compaction quality is reported as percentage reduction in the original vector set. The CPU seconds are reported for Sun UltraSPARC workstation. CPU seconds reported are platform-specific. Therefore, to provide information on the complexity of the algorithm, the time taken for fault simulation of all faults using original vector set is also reported. These times are reported under column Initial Sim. Time. The column Improved RSP represents a speeded up version of the fastest algorithm proposed in I. Pomeranz, and S. M. Reddy, "Vector Restoration Based Static Compaction of Test Sequences for Synchronous Sequential Circuits," *Proceedings Int. Conf. on Computer Design*, pp. 360–365, University of Iowa, Aug. 1997. Results from the described embodiment of the present invention are given in column SECO.

The number of gates and number of flip flops in industrial designs used in the experiments are given in Table 2 shown in FIG. 6. Due to the nature of vector restoration based approaches, the fault coverage of the original vector set is always preserved by the compacted vector set. Therefore, fault coverage numbers are not reported. Table 2 also shows results obtained by using the acceleration techniques described above.

Results obtained by using the two-phase restoration and the accelerated two-phase restoration methods, as described in the above mentioned co-pending U.S. patent application Ser. No. 09/112,945, are reported in columns 2-$\phi$ and 2-$\phi^*$, respectively.

The initial vector sets used for ISCAS circuits are obtained using the test set generator HITEC. See T. M. Niermann and I. H. Patel, "HITEC: A test generation package for sequential circuits," *Proc. European Conf. Design Automation (EDAC)*, pp. 214–218, Mar. 1991. The results for compaction on ISCAS circuits are given in Table 1. Both SECO and RSP techniques gave an average compaction of 40 percent, but SECO was significantly faster. For the smaller ISCAS circuits (s344 and s444), the RSP approach gives better compaction. For all other ISCAS designs, the difference in compaction quality between the two methods is negligible. Clearly, SECO is much better than Improved RSP in terms of CPU seconds taken. In circuits like, s1494 and s1488, present technique is 30 times faster and the difference in compaction efficiency is negligible. For ISCAS designs, on the average, SECO compacts in about twice the time taken for a fault simulation of all faults using the original vector set.

Industrial designs have several non-Boolean primitives, such as tri-state buffers, bidirectional buffers and buses. In addition, they have set/reset flip-flops and multiple clocks. Original test sets for these circuits were derived using a commercial test generator. Compaction results are shown in Table 2. In general, the time taken by SECO is about 2 to 10 times the initial fault simulation time. As demonstrated in the table, SECO runs 20 to 50 times faster than RSP and gives better compaction. For example, for industrial design p7B, SECO gives 27 percent compaction in 179 seconds, while the improved RSP approach requires 10200 seconds for only 25 percent compaction. SECO is able to complete on large designs containing about 200,000 gates and 5000 flip flops, while RSP does not complete even after 2 CPU days. The overlapped validation and refinement techniques have also been implemented. Results for these techniques are reported in column SECO with 2-$\phi^*$. The 2-$\phi^*$ version is particularly effective for circuits with large segments. For example, in industrial design p306 there is a segment of 2666 vectors and the use of 2-$\phi^*$ results in more than a factor of 2 improvement in CPU seconds.

Table 3 shown in FIG. 8 presents the results of SECO with segment pruning. The segment pruning technique of the present invention improves compaction quality by avoiding redundant use of synchronizing prefix. Table 3 presents results of SECO with segment pruning. Segment pruning produced significant improvement in compaction quality for some circuits. For example, for the ISCAS circuit s526, only 32 percent compaction was possible without segment pruning. However, compaction quality doubled to 63 percent with segment pruning. This demonstrates the significant improvement achievable by segment pruning. The experimental results also show that segment pruning technique provides considerable improvement when used in testing of industrial designs.

The experimental results demonstrate the superiority of the static compaction algorithm of the present invention in terms of performance and compaction efficiency. The embodiment of the present invention SECO is a significant improvement over the known static compaction techniques.

IVG. Conclusion

A new static compaction technique according to the present invention is significantly superior to existing techniques. The new technique is based on vector restoration idea, but the use of segments and two-phase restoration results in a significant improvement. The described two-phase restoration and segment manipulation techniques of the present invention can also be used in existing static compaction methods to further improve CPU times and compaction quality.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method for compacting a sequence of test vectors for testing a system, said system having a set of faults detectable by the sequence of test vectors, a subset of said set of faults being chosen as target faults, said method comprising a restoration phase and a segment manipulation phase, wherein, said restoration phase identifies segments of said vectors, each of said segments detects one of said target faults, and said segment manipulation phase further comprises re-ordering, pruning and merging said segments, wherein a segment is a subsequence of vectors in the sequence of test vectors such that a detection time for any future target fault not yet detected is earlier than a time associated with a first vector in the subsequence of vectors, wherein re-ordering of segments is performed for better compaction, wherein during merging segments are merged into a compact set and compaction is complete when said compact set detects all faults in the target fault list wherein during pruning compaction is done by considering two overlapping segments by retaining synchronizing sequence of first of said two overlapping segments and pruning the synchronizing sequence from all segments other than said first segment.

2. The method of claim 1, wherein:

said restoration phase comprises a validation subphase and a refinement subphase;

said validation subphase identifies a first subsequence of test vectors that detects a target fault and a second subsequence that does not detect the target fault; and said refinement subphase identifies the shortest subsequence in between the first subsequence and the second subsequence that detects the target fault.

3. A method for compacting a sequence of test vectors wherein segments when found are merged into a compact set, said method comprising:
   (a) identifying test vectors, a fault list comprising faults that can be detected using said test vectors and detection times for said faults;
   (b) selecting target faults if said target faults exist;
   (c) performing two-phase vector restoration and augmenting a partial segment set if the two-phase vector restoration detects target faults selected in step b;
   (d) pruning the segment obtained in step c if the partial segment set is a segment;
   (e) merging the segment obtained in step c into a compact set if the partial segment set is a segment;
   (g) repeating steps (b)–(e) while target faults exist in step (b)i
   wherein a segment is a subsequence of vectors in the sequence of test vectors such that a detection time for any future target fault not yet detected is earlier than a time associated with a first vector in the subsequence of vectors.

4. The method of claim 3 wherein the merging phase of step e comprises:
   (e) (1) simulating new segment from known initial state obtained after simulating vectors in the compact set;
   (e) (2) adding the new segment to the end of said compact set.

5. The method of claim 3 wherein step c comprises:
   (c) (1) performing overlapped validation such that if two faults have restored sequences that overlap then the two faults are merged as one target fault; and
   (c) (2) performing overlapped refinement if a segment that detects target faults exists.

6. A method of pruning a segment to speed up compaction, said method comprises:

(a) assigning j=1;
   (b) creating a sequence list having j-th element of an input segment as a first element of the sequence list, and last element of the input segment as a last element the sequence list;
   (c) running simulation to simulate faults that are detected by the input segment from a known initial state obtained after simulation of vectors in a pre-existing compact set;
   (d) assigning j=j+1;
   (e) repeating steps (b)–(d) until a subset of input faults is no longer detected;
   (f) outputting segment starting with j–1 element of the input segment and ending with the last element of the input segment.

7. A method for compacting a sequence of test vectors comprising:
   a) generating a sequence of test vectors;
   b) generating one or more segments from said sequence of test vectors; and
   c) using said segments for compacting said sequence of test vectors,
   wherein a segment is a subsequence of vectors in the sequence of test vectors such that a detection time for any future target fault not yet detected is earlier than a time associated with a fast vector in the subsequence of vectors.

8. The method of claim 7 further comprising:
   d) pruning said segments,
   wherein during pruning compaction is done by considering all combinations of two overlapping segments by retaining synchronizing sequence of first of said two overlapping segments and pruning the synchronizing sequence from all segments other than said first segment.

9. The method of claim 7 further comprising the use of segment re-ordering.

* * * * *